(12) United States Patent
Babayan et al.

(10) Patent No.: US 10,822,699 B2
(45) Date of Patent: Nov. 3, 2020

(54) TECHNIQUES FOR CONTROLLING PRECURSORS IN CHEMICAL DEPOSITION PROCESSES

(71) Applicant: Varian Semiconductor Equipment Associates, Inc., Gloucester, MA (US)

(72) Inventors: Elaina Babayan, Gloucester, MA (US); Sarah White, Gloucester, MA (US); Vijay Venugopal, Gloucester, MA (US); Jonathan Bakke, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 84 days.

(21) Appl. No.: 15/946,483

(22) Filed: Apr. 5, 2018

(65) Prior Publication Data
US 2019/0203358 A1 Jul. 4, 2019

Related U.S. Application Data

(60) Provisional application No. 62/611,645, filed on Dec. 29, 2017.

(51) Int. Cl.
| | |
|---|---|
| C23C 16/50 | (2006.01) |
| C23C 16/52 | (2006.01) |
| C23C 16/448 | (2006.01) |
| H01L 21/67 | (2006.01) |
| C23C 16/455 | (2006.01) |

(52) U.S. Cl.
CPC ............ *C23C 16/52* (2013.01); *C23C 16/448* (2013.01); *C23C 16/45544* (2013.01); *C23C 16/45553* (2013.01); *H01L 21/67253* (2013.01)

(58) Field of Classification Search
CPC .............. C23C 16/52; C23C 16/45553; C23C 16/45544; C23C 16/448; H01L 21/67253; B01J 2208/00008
USPC ............ 118/663, 696, 697, 698; 156/345.24, 156/345.26; 700/266
See application file for complete search history.

(56) References Cited

U.S. PATENT DOCUMENTS

| | | | |
|---|---|---|---|
| 5,652,431 A | 7/1997 | DeSisto et al. | |
| 6,348,099 B1 * | 2/2002 | Xia ....................... | C23C 16/401 118/697 |
| 2002/0022087 A1 | 2/2002 | Satake et al. | |
| 2004/0015300 A1 | 1/2004 | Ganguli et al. | |
| 2008/0044573 A1 | 2/2008 | Chen et al. | |
| 2012/0009694 A1 * | 1/2012 | Maslar .............. | C23C 16/45544 438/16 |

OTHER PUBLICATIONS

International Search Report and Written Opinion dated Apr. 24, 2019 for PCT/US2018/067520 filed Dec. 26, 2018.

* cited by examiner

*Primary Examiner* — Rudy Zervigon

(57) ABSTRACT

An apparatus for controlling precursor flow. The apparatus may include a processor; and a memory unit coupled to the processor, including a flux control routine. The flux control routine may be operative on the processor to monitor the precursor flow and may include a flux calculation processor to determine a precursor flux value based upon a change in detected signal intensity received from a cell of a gas delivery system to deliver a precursor.

15 Claims, 15 Drawing Sheets

TECHNIQUES FOR CONTROLLING PRECURSORS IN CHEMICAL DEPOSITION PROCESSES

RELATED APPLICATIONS

This application claims priority to U.S. Provisional Patent Application No. 62/611,645, filed Dec. 29, 2017, entitled TECHNIQUES FOR CONTROLLING PRECURSORS IN CHEMICAL DEPOSITION PROCESSES, and incorporated by reference herein in its entirety.

FIELD

The present embodiments relate to deposition processes, and more particularly, to control of precursors in chemical deposition processes.

BACKGROUND

In the present day, device fabrication, such as semiconductor device fabrication may entail chemical deposition processes to form thin layers with precise thickness control, including over three dimensional structures. Such chemical deposition processes include chemical vapor deposition (CVD) and atomic layer deposition (ALD), among other processes.

Such chemical deposition processes may involve delivering precursors from a solid source, gas source, or liquid source, such as an ampoule. For example, the precursor may be delivered from an ampoule to a process chamber, where the precursor reacts to form a layer or sub-layer on a substrate. In present day apparatus, the amount of precursor being delivered may not be properly characterized, leading to variability in delivery of precursor substrate-to-substrate, ampoule-to-ampoule, or over the lifetime of an ampoule. Delay in detecting ampoule end of life can result in significant amount of wafer (substrate) discard. As a precaution, users may track carrier gas flow through an ampoule and may halt the use of a precursor in an ampoule well before actual end of life, resulting in a considerable portion of the ampoule fill being unused, and causing higher overall cost.

With respect to these and other considerations the present disclosure is provided.

SUMMARY

In one embodiment, an apparatus for controlling precursor flow may include a processor, and a memory unit coupled to the processor, including a flux control routine. The flux control routine may be operative on the processor to monitor the precursor flow. The flux control routine may include a flux calculation processor to determine a precursor flux value based upon a change in detected signal intensity received from a cell of a gas delivery system to deliver a precursor.

In an additional embodiment, a method of controlling precursor flow may include providing a flow of a precursor through a gas delivery system, measuring a change in detected signal intensity in a cell of the gas delivery system, caused by the flow of the precursor, and determining a precursor flux value based upon the change in detected signal intensity.

In another embodiment, an apparatus for controlling precursor flow may include a source to output the precursor, and a sensor assembly, communicatively coupled to the source. The sensor assembly may include a cell, coupled to the source, to receive and conduct the precursor, a light source, disposed on a first side of the cell, to transmit light into the cell, and a detector, disposed on a second side of the cell, opposite the light source, to detect light transmitted through the cell. The apparatus may also include a control system, the control system arranged to determine a precursor flux value based upon a change in detected light intensity received from the cell during flow of the precursor through the cell.

Figure 1A:
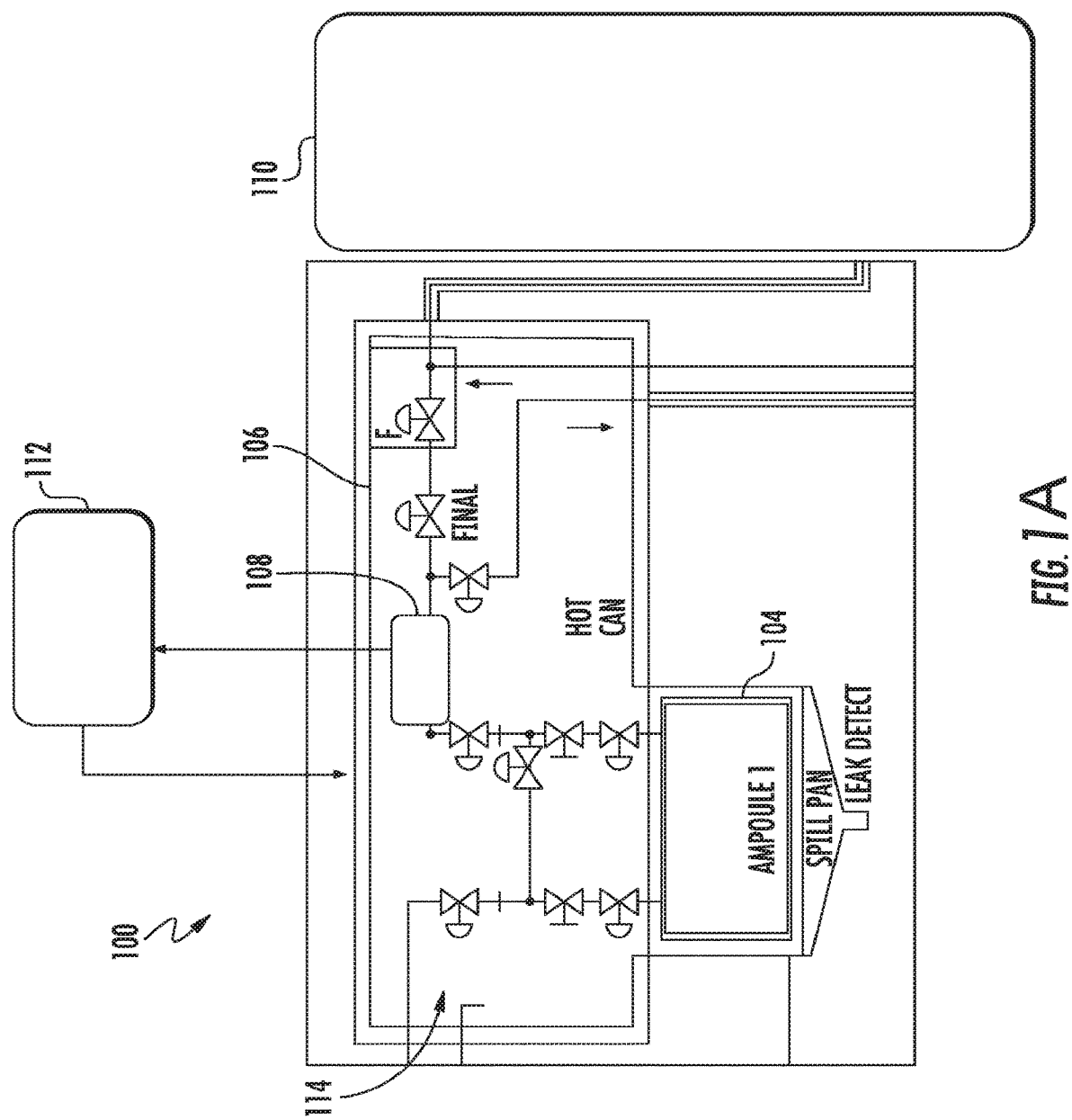
FIG. 1A shows a system for chemical deposition, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The embodiments described herein provide novel processing and control of precursors in chemical deposition processes, such as atomic layer deposition (ALD) processes. ALD generally involves sequential exposure to two or more reactants to deposit a given monolayer of material. In various embodiments, a chemical deposition process may be performed to deposit any appropriate material, including oxides, nitride, carbides, dielectrics, semiconductors, or metal. The chemical deposition process may involve control of precursor flow as detailed in the embodiments to follow.

Turning now to FIG. 1A, there is shown a system 100 for chemical deposition, according to embodiments of the disclosure. The system 100 involves use of at least one precursor, generally provided as a gaseous species to process chamber, referred to as deposition chamber 110. The system 100 may be employed to perform chemical vapor deposition (CVD) or atomic layer deposition (ALD) in different embodiments. The embodiments are not limited in this context. The system 100 includes a source, such as ampoule 104, where the ampoule 104 may contain a solid, liquid or gas. The ampoule 104 may be maintained at an elevated temperature to generate a gaseous species, which species may be referred to herein as a precursor. The ampoule 104 may be coupled to a delivery system 114, configured to conduct at least one gaseous species, and in some cases, multiple gaseous species, to the deposition chamber 110, as in known CVD or ALD systems. For example, the delivery system 114 may include a plurality of gas lines, valves, and flow controllers. At least a portion of the delivery system 114 may be contained within a hot chamber 106, where the hot chamber 106 is maintained at an elevated temperature with respect to the ampoule 104, ensuring percursor(s) remain in a gaseous state, at least until entering deposition chamber 110.

Figure 1B:
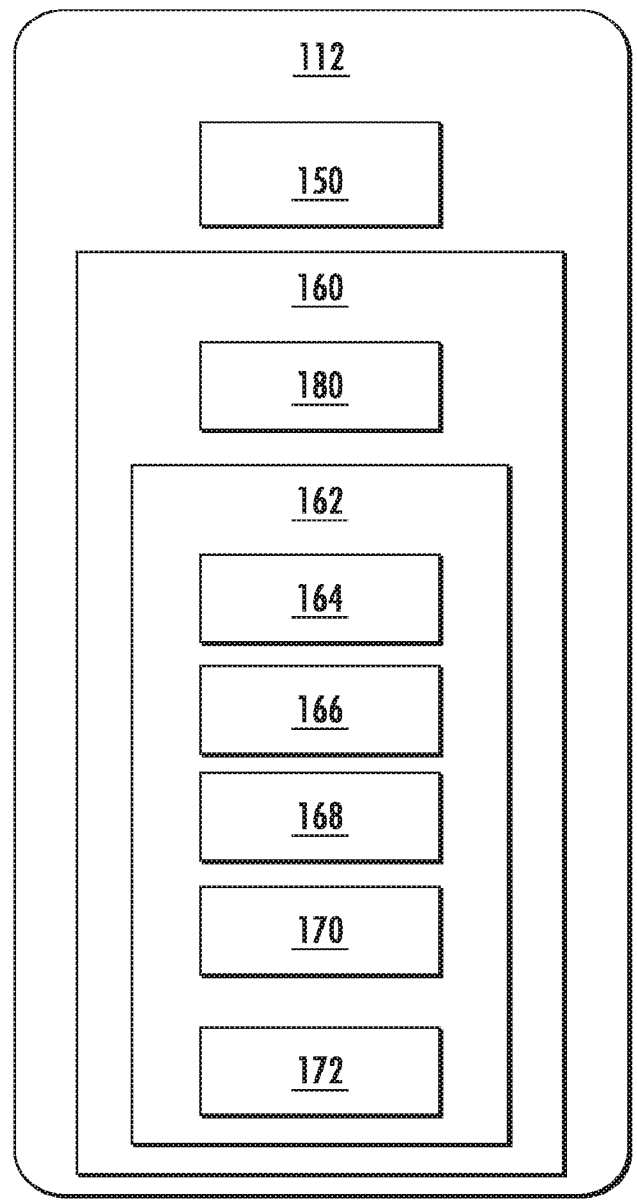
FIG. 1B shows one embodiment of a control system of the system of FIG. 1A.

The system 100 may further include a sensor assembly 108, arranged to monitor flow of at least one precursor between the ampoule 104 and deposition chamber 110. The sensor assembly 108 may be coupled to a control system 112, where the control system 112 may output information or signals to a user, as well as send control signals for controlling operating parameters of system 100, including temperature, precursor flow, and so forth. Details of an embodiment of the control system 112 are shown in FIG. 1B and discussed further below.

In accordance with embodiments of the disclosure, the control system 112 may be implemented in a combination of hardware and software. The control system 112 may comprise various hardware elements, software elements, or a combination of hardware/software. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), and programmable logic devices (PLD). Examples of hardware elements may also include digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, and functions. Examples of software elements may also include methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

As an example, the control system 112 may include various hardware outputs, which outputs may be embodied as signals for controlling other components of system 100, may be output on user interfaces, or output in other manner. In some examples, the hardware outputs may be employed as inputs by control system 112 to control components of system 100, as detailed below. Table I includes a listing of exemplary hardware outputs according to some embodiments of the disclosure. In this example, temperature, such as temperature of the ampoule 104, may be output, as well as gas pressure, precursor concentration, and a health monitor (reference signal).

TABLE I

| Output |
| --- |
| Temperature (C.) |
| Pressure (T) |
| Concentration (%) |
| Health Monitor (a.u.) |

These outputs may be collected periodically, intermittently, and in synchronicity, or separately (in time) from one another.

Turning now to Table II, there are shown a set of operations or capabilities where the capabilities may be performed by the control system 112, according to some embodiments of the disclosure, where these capabilities are detailed in the discussion to follow.

TABLE II

| Capability | Purpose |
| --- | --- |
| Chamber Flux (umol/sec) | Model for precursor flux delivered to wafer |
| Integrated Ch. Flux (umol) | Total precursor flux over a wafer |
| Ampoule Integrated flux | Lifetime flux of precursor ampoule |
| End of life Detection | Signals ampoule change needed |
| Fault detection | Detect and classify faults (e.g. clogs) |
| Ampoule T compensation | Feedback loop for dynamic T adjust |

Turning now to FIG. 1B, there is shown another depiction of the control system 112. In various embodiments, the control system 112, may include a processor 150, such as a known type of microprocessor, dedicated semiconductor processor chip, general purpose semiconductor processor chip, or similar device. The control system 112 may further include a memory or memory unit 160, coupled to the processor 150, where the memory unit 160 contains a flux control routine 162, as described below. The flux control routine 162 may be operative on the processor 150 to control precursor flux or precursor flow in the system 100, as detailed below. In some embodiments, the flux control routine 162 may include an end-of-life processor 164, an excursion processor 166, and a clog-detection processor 168, a temperature control processor 170, and a flux calculation processor 172, where implementation of these processors is described with respect to the embodiments discussed below.

The memory unit 160 may comprise an article of manufacture. In one embodiment, the memory unit 160 may comprise any non-transitory computer readable medium or machine readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

The memory unit 160 may include a system database 180, including parameters for operating the system 100. Exemplary parameters include, for example, a baseline ampoule side temperature and a baseline ampoule bottom temperature, where these parameters may be set as starting points for control operations to be performed, such as for temperature compensation to be performed. Other parameters subject to control may include flow rate as well as deposition time. Additional parameters, which parameters may also be stored in system database 180, may be employed to assign limits to ensure the temperature of a process stays within a safe range. Among these parameters are ampoule side temperature minimum, ampoule side temperature maximum, ampoule bottom temperature minimum, ampoule bottom temperature maximum, hot chamber temperature, and precursor degradation temperature.

Figure 1C:
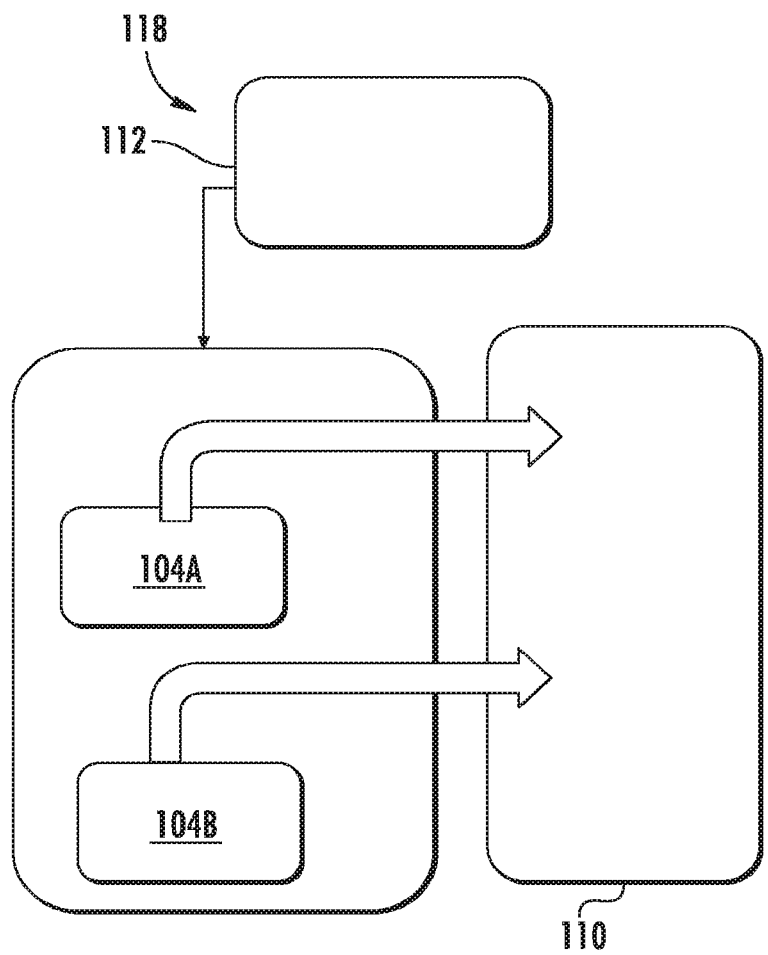
FIG. 1C shows another system for chemical deposition, according to embodiments of the disclosure.

Turning now to FIG. 1C, there is shown a system 118 for chemical deposition, according to further embodiments of the disclosure. The system 118 involves use of at multiple precursors, generally provided as a gaseous species to process chamber, referred to as deposition chamber 110. The system 118 may operate similarly to system 100, while the system 118 includes a first ampoule 104A for a first precursor and a second ampoule 104B for a second precursor. The control system 112 may act to independently control the first ampoule 104A and the second ampoule 104B according to the principles detailed in the discussion to follow. This configuration facilitates control of two different precursors where the different precursors may be used form different condensing species in a CVD or ALD process. In other embodiments, a system, such as system 100 or system 118, may be coupled with a gas flow apparatus supplying a gaseous precursor from a gas source to a deposition chamber, such as $NH_3$ or $H_2$. As such, a CVD or ALD system may employ the gas source to deliver the gaseous precursor, while at least one other precursor is delivered from an ampoule under active control according the embodiments described herein.

Figure 2A:
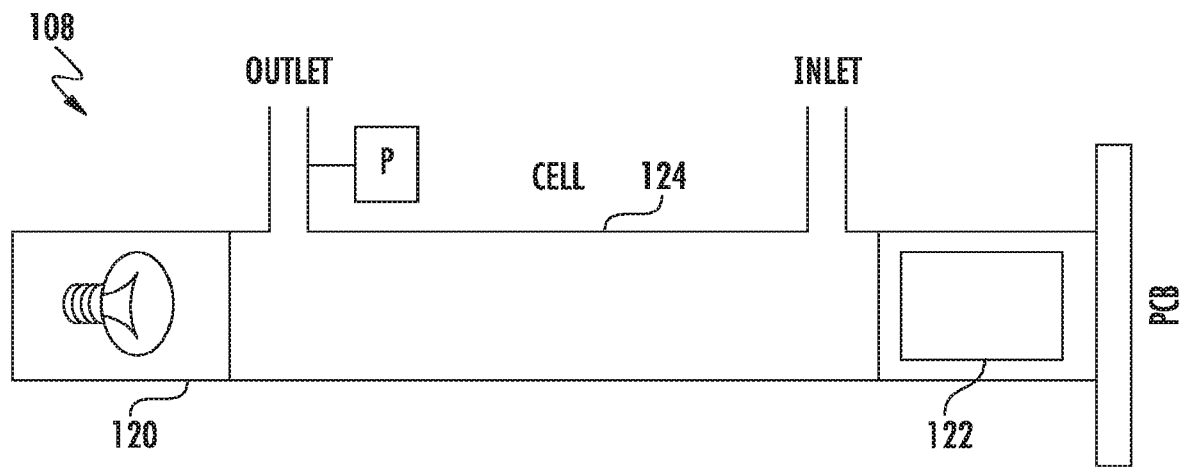
FIGS. 2A to 2B show operation of a sensor assembly according to embodiments of the disclosure.
Figure 2B:
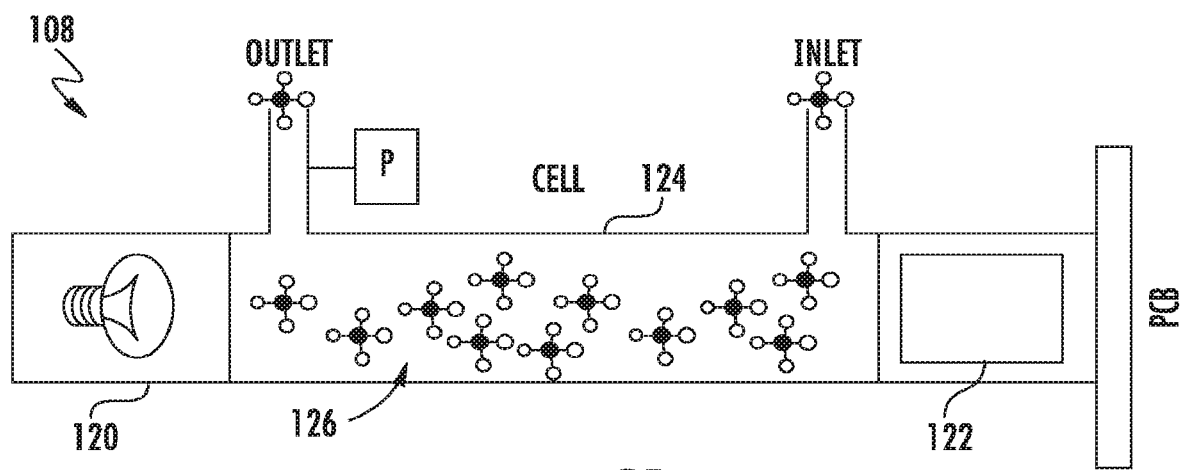
Figure 3A:
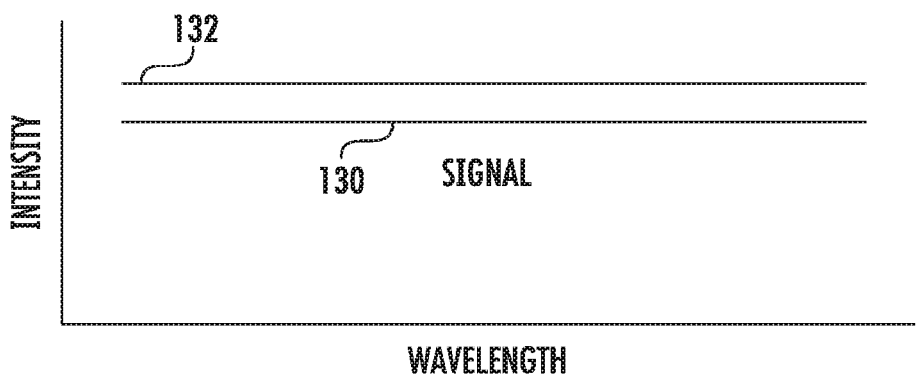
FIGS. 3A and 3B illustrate exemplary signals collected by the sensor assembly of FIG. 2A.

In various embodiments, the sensor assembly 108 may be arranged with any suitable components for monitoring a precursor, including electromagnetic radiation, acoustic signals, and so forth. The embodiments are not limited in this context. The sensor assembly 108 may determine precursor flux or concentration by measuring a change in signal intensity of an appropriate signal transmitted through the sensor assembly 108, as detailed below. Turning to FIG. 2A and FIG. 2B, there is shown principle of operation of the sensor assembly 108, in accordance with some embodiments of the disclosure. The sensor assembly 108 may include a light source 120, such as an infrared, visible, or ultraviolet light source, and a detector 122, facing the light source 120. The detector 122 may be any detector, appropriate for the type of radiation source used for light source 120. The sensor assembly 108 may further include a chamber, shown as cell 124, where the cell 124 is arranged to receive a precursor 126 and to conduct the precursor 126, as the precursor 126 travels from the ampoule 104 to the deposition chamber 110. When the precursor 126 is absent from the cell 124, as in FIG. 2A, the detector 122 may register a signal, such as the background signal 130. The background signal 130 represents transmitted (detected) intensity as a function of wavelength of the radiation from light source 120. In some embodiments, the background signal 130 may be featureless, such as shown in FIG. 3A. When precursor 126 is present in the cell 124, the precursor may absorb radiation emitted by the light source 120, wherein the detector 122 registers a precursor signal 134. For clarity of explanation, the precursor signal 134 is shown to exhibit a peak 136, while the precursor signal 134 may include a multiplicity of features, including multiple peaks in some embodiments. Notably, the presence of the precursor 126 in the cell 124 may reduce the overall intensity of detected radiation in precursor signal 134, as opposed to background signal 130. As detailed below, in various embodiments, the recording of the background signal 130, as well as the monitoring of the precursor signal 134, over a plurality of instances, is employed to control operation of a deposition process.

Figure 3B:
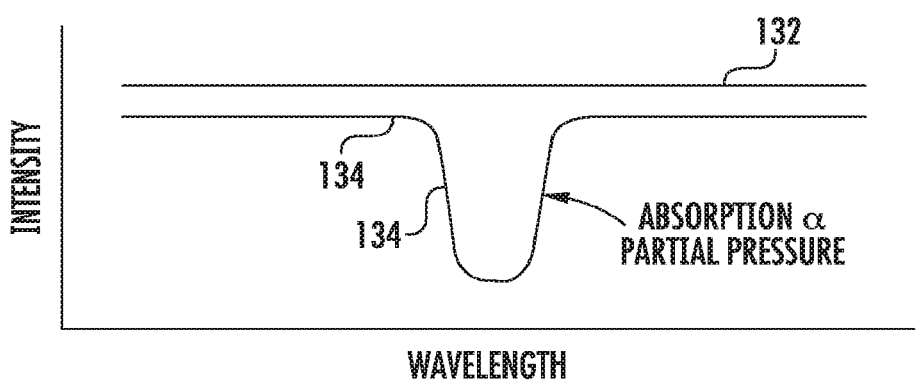

As further shown in FIGS. 3A and 3B the sensor assembly may also collect a reference signal 132, where the reference signal 132 indicates the relative changes inn detector performance of the detector 122 over time. Changes in intensity of the reference signal 132 may be indicative of degradation in performance of the detector 122. By collecting the reference signal 132 at various instances, in conjunction with measuring the background signal 130, and precursor signal 134, the amount of precursor 126 may be accurately determined over time. In particular, the light absorption by precursor 126 may be directly proportional to the partial pressure of the precursor 126 in the cell 124. As such, physical modelling may be employed to calculate precursor flux at multiple instances, based upon the repeated measurement of a precursor signal 134, facilitating better control of chemical deposition processes involving the precursor 126. In addition to measuring precursor flux, the cell pressure, such as total pressure, in the cell 124 may also be measured.

Figure 4:
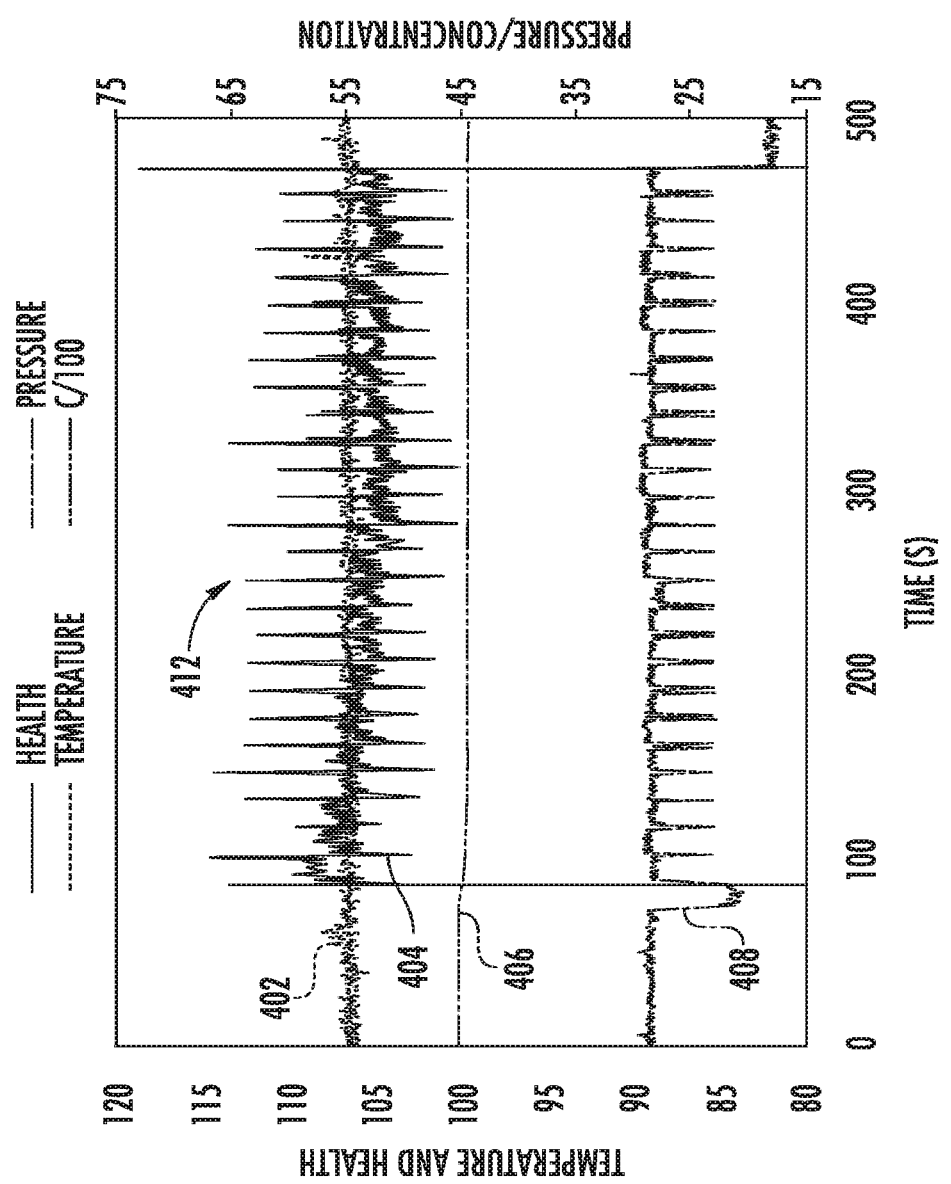
FIG. 4 shows a graphical depiction of various outputs of a control system, in accordance with embodiments of the disclosure.

Turning now to FIG. 4 there is shown a graphical depiction of various outputs of the control system 112, in accordance with embodiments of the disclosure. The curve 402 illustrates temperature of the ampoule 104 as a function of time. In this example, the temperature is relatively constant as a function of time. During a deposition process, the changing of temperature may result in the changing of precursor flux by heating the ampoule 104 to generate a higher partial pressure of precursor.

The curve 406 represents the reference intensity of a detector, for example, indicating the detector continues to function the same over the time period measured. The health of a sensor may be determined from comparison of a reference intensity value taken at a certain time, with respect to the reference intensity at a current time. Thus, if the value of the reference intensity deteriorates substantially over time, this deterioration may be deemed an indication of bad health of the sensor. The curve 408 represents the pressure in a chamber as a function of time, while the curve 404 represents the concentration of a precursor as a function of time. As shown, the precursor is delivered in a series of pulses of concentration 412, resulting in corresponding pulses of pressure.

Figure 5:
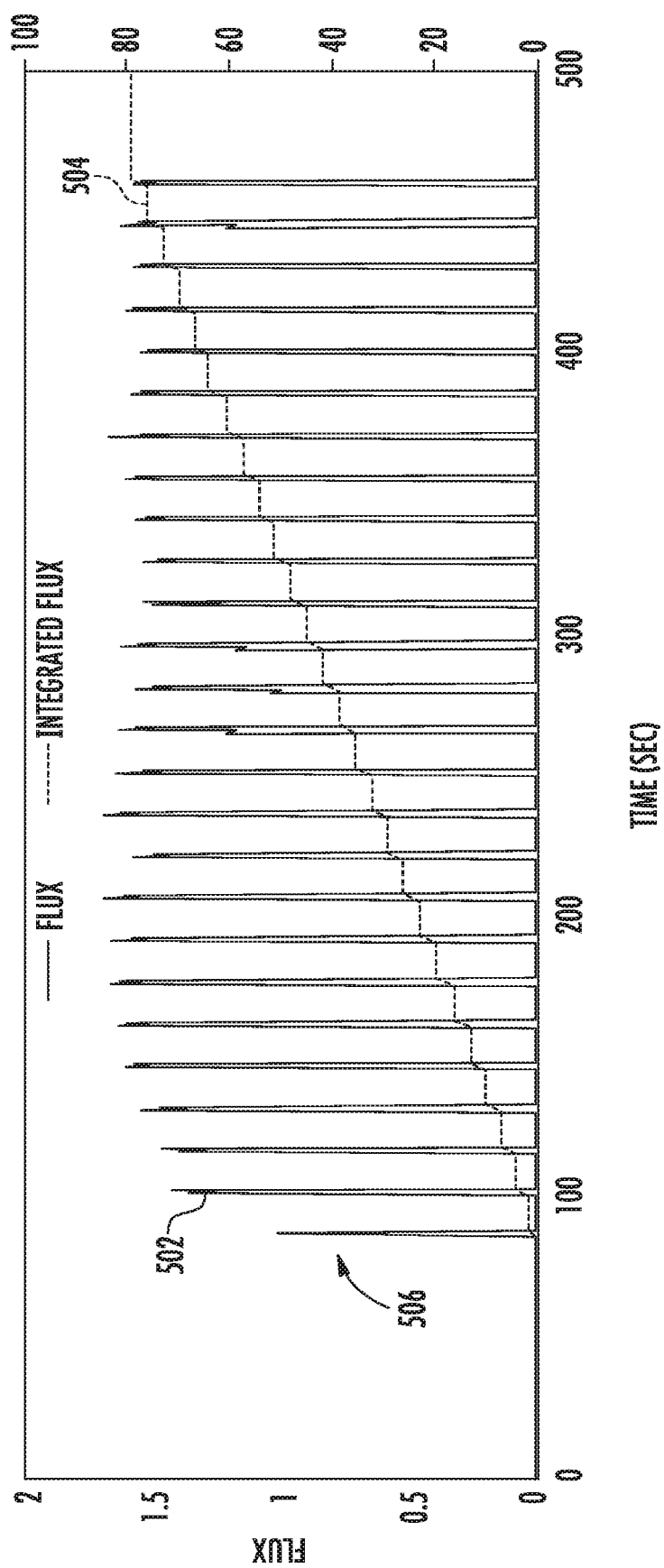
FIG. 5 is a composite graph depicting precursor flux and integrated flux over time, according to some embodiments.

Turning now to FIG. 5 there is shown a curve 502, representing the precursor flux transported through a system, such as the flux of a precursor conducted through the sensor assembly 108. In accordance with various embodiments of the disclosure, a physics-based calculation is performed to determine precursor flux, where the calculation does not require a constant pressure or temperature at a sensor, such as detector 122, or within the gaslines used to conduct the precursor from an ampoule to deposition chamber. In the example of FIG. 5, the curve 502 exhibits a series of pulses 506, representing pulses in precursor flux, generated by pulses of the precursor. The curve 504 represents the integrated flux of precursor over time, representing a sum of the pulses 506. The curve 504 may be indicative of the amount of precursor delivered to a deposition chamber at any given instance in time. A sensor assembly, such as sensor assembly 108, may be maintained in an operational state during the chemical deposition process, so any pulse 506 is recorded, wherein the integrated flux at a given instance represents the sum of all the flux pulses recorded to that point.

While the example of FIG. 4 and FIG. 5 are directed to precursor flux monitoring, in other embodiments, byproducts or secondary precursors may be monitored. For example, in some chemical systems, a precursor may decompose during transport, wherein the precursor as well as the byproduct of decomposition may pass through a detector cell. Accordingly, by adding an additional detector, so a precursor detector, byproduct detector, and health detector are present, such a detector system may be used to determine relative flow of a precursor vs a byproduct.

The determination of precursor flux and integrated precursor flux may be used to monitor, characterize, or control a deposition process in accordance with various embodiments of the disclosure. FIG. 6A, FIG. 6B, FIG. 6C, and FIG. 6D are exemplary graphs illustrating the relationship between integrated flux or related entities and certain experimental or operating parameters of a system, such as the system 100. The data shown represent the deposition of Cobalt using a (3,3-Dimethyl-1-butyne) dicobalthexacarbonyl (CCTBA) precursor. This chemical system is merely exemplary, and in other embodiments other metal organic or halogen species may be used to deposit cobalt, or other metal.

Figure 6A:
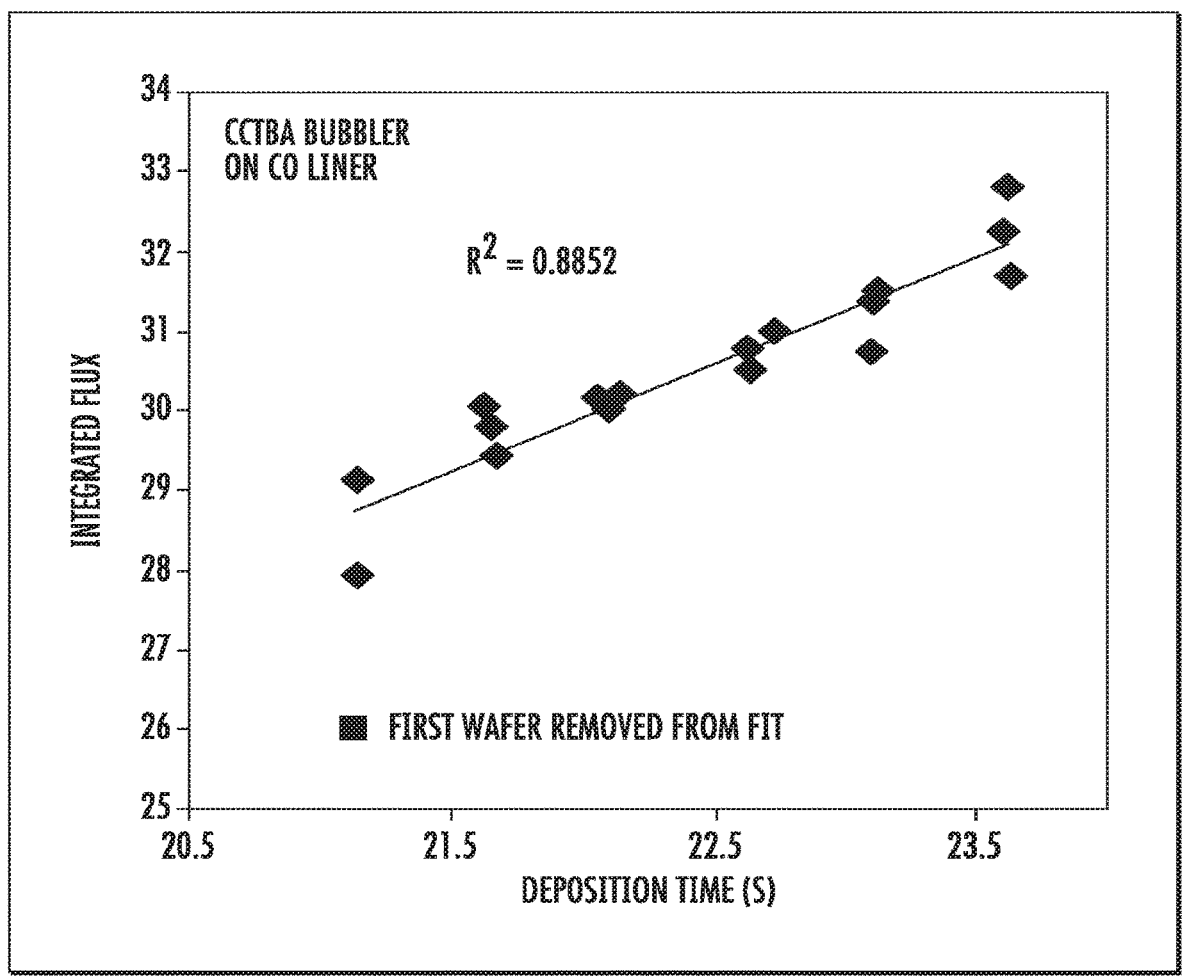
FIG. 6A, FIG. 6B, FIG. 6C, and FIG. 6D are exemplary graphs that illustrate the relationship between integrated flux or related entities and operating parameters of a system, in accordance with embodiments of the disclosure.
Figure 6B:
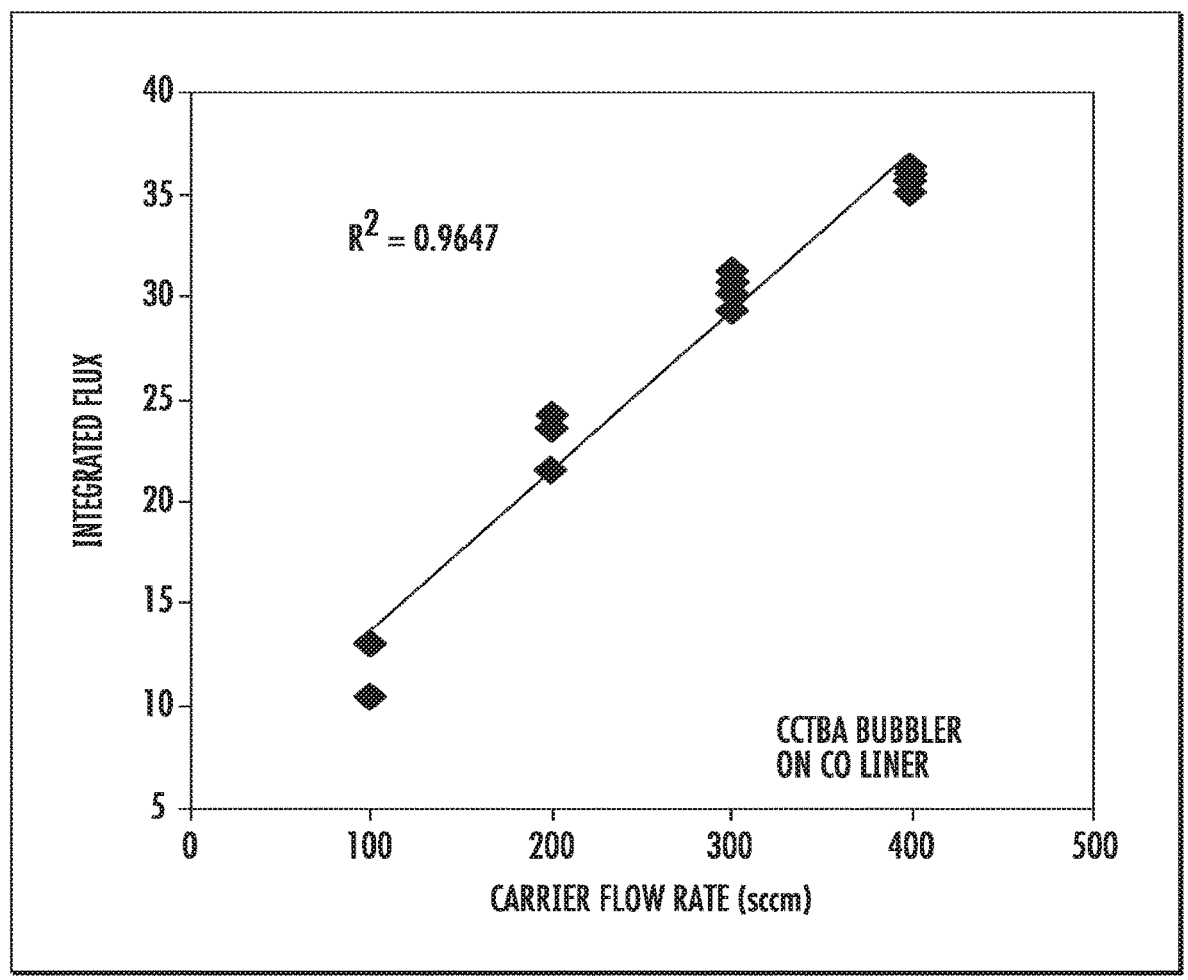
Figure 6C:
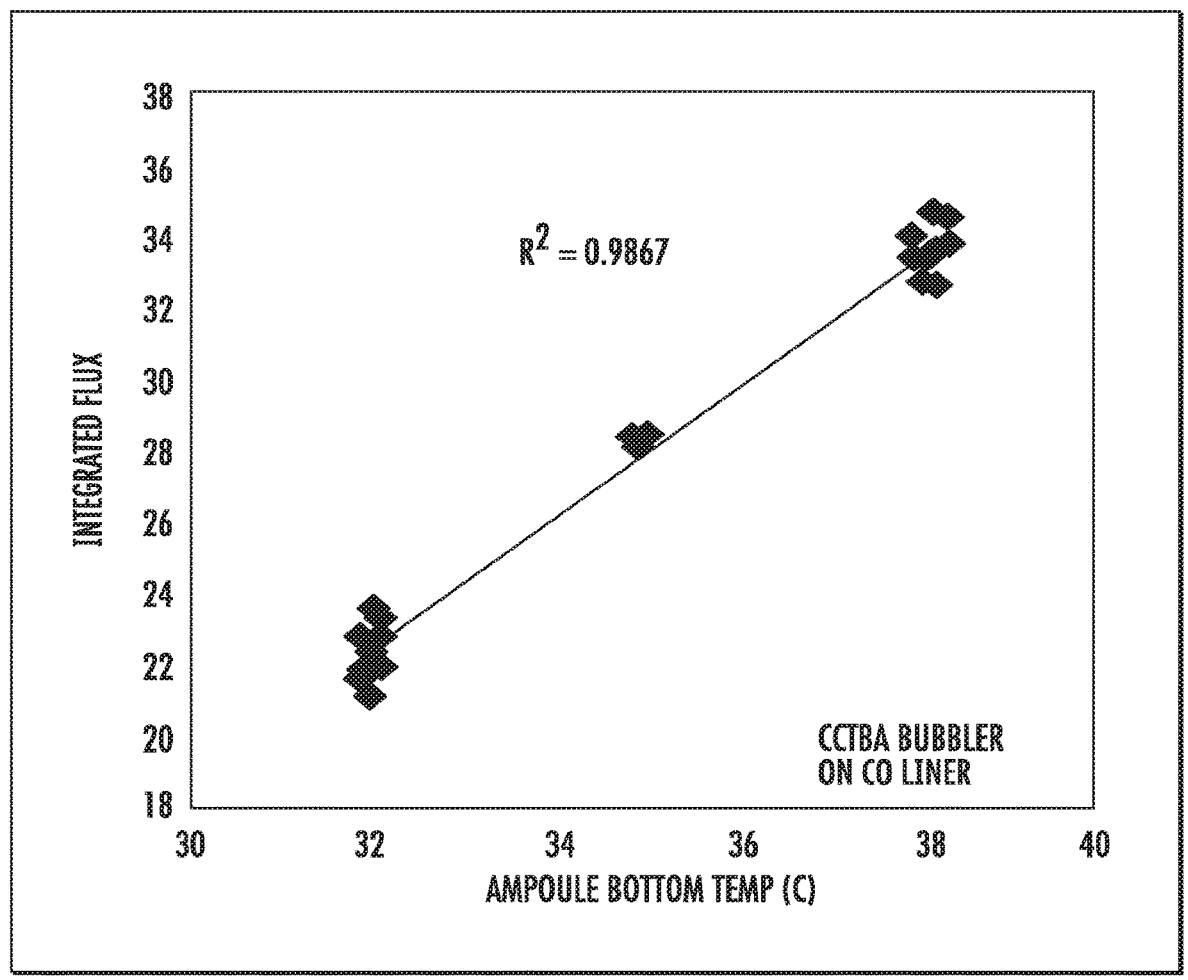

In FIG. 6A, there is shown the relationship between integrated flux and deposition time, for measurement collected over a deposition time window as shown. The integrated flux is determined using a sensor assembly as described above. As shown, the integrated flux shows a good linear fit with deposition time. FIG. 6B depicts the relationship between carrier gas flow rate and integrated flux, again showing linear behavior over a carrier flow rate between 100 sccm and 400 sccm. FIG. 6C depicts the relationship between ampoule bottom temperature and integrated flux, again showing linear behavior over a temperature range between 32 C and 38 C.

Figure 6D:
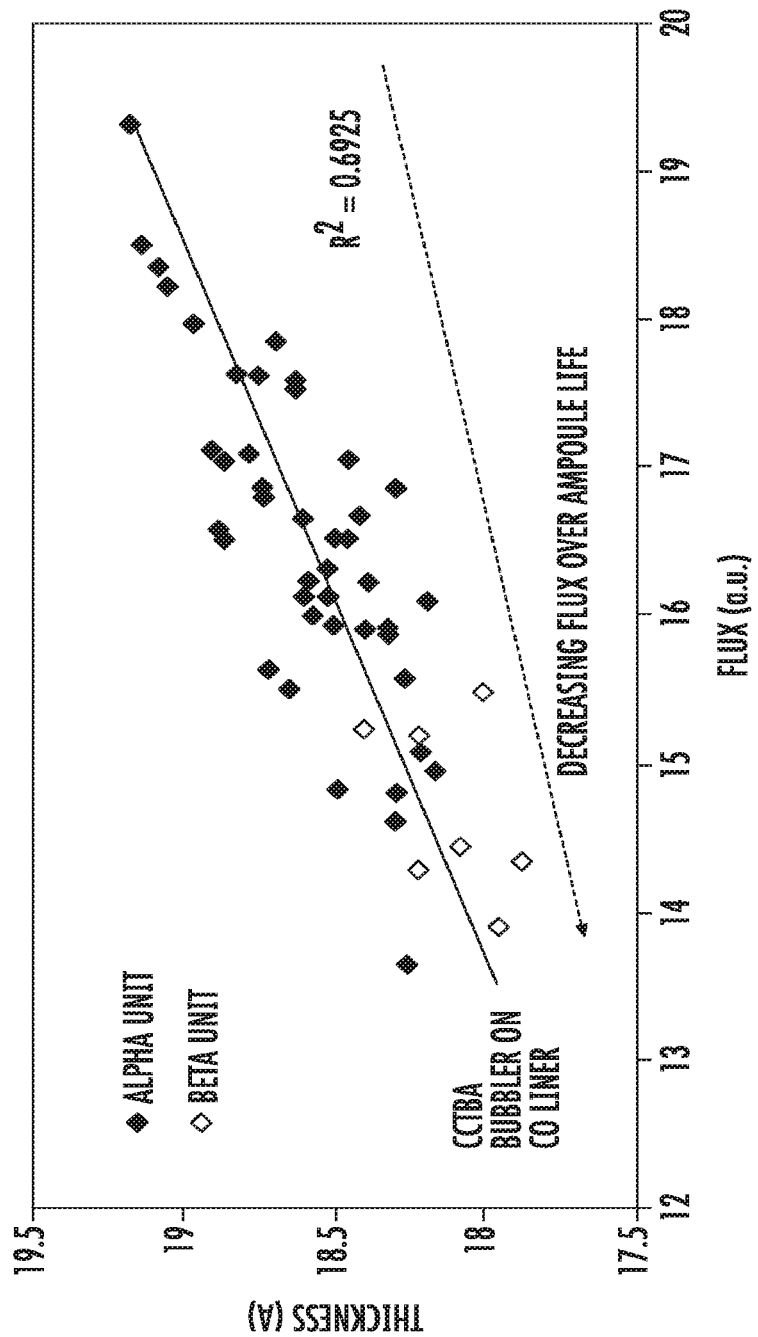

In FIG. 6D, there is shown the measured thickness of a deposit as a function of flux, showing a linear relation for two different units (alpha and beta). The data toward the right represents data collected toward the beginning of the ampoule life while a decrease in flux and deposit thickness occurs as the ampoule precursor material is consumed.

Thus, the data shown in FIGS. 6A-6D illustrate how integrated flux in a chemical deposition system such as cobalt is sensitive to parameters including deposition time, carrier flow rate, and ampoule temperature. In other embodiments, dilution flow of any other flow to a process chamber, the number of deposition steps, or chamber pressure may be modulated to control precursor flux.

Figure 7:
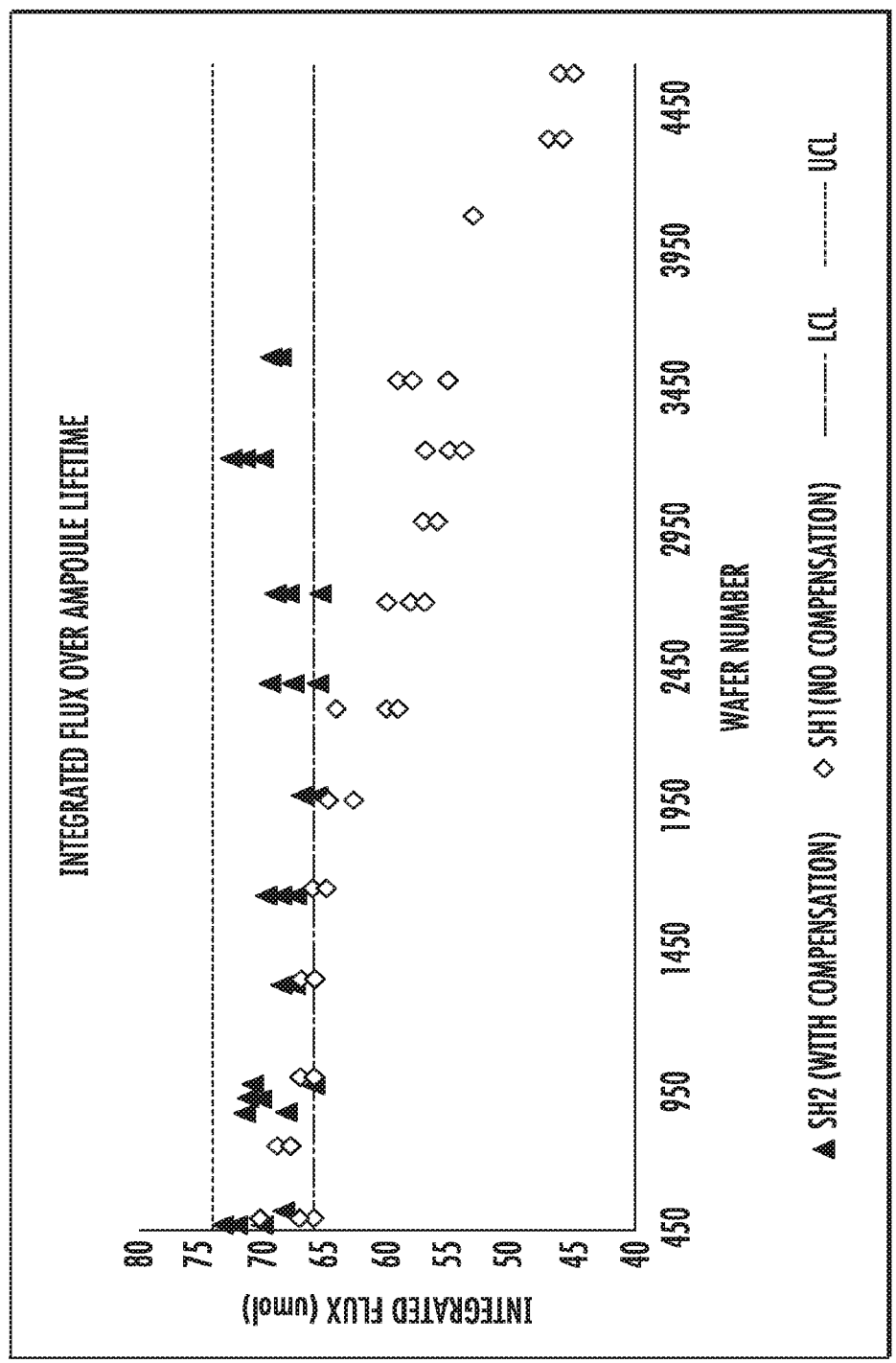
FIG. 7 illustrates integrated precursor flux behavior as a function of time, with and without temperature compensation, in accordance with embodiments of the disclosure.

In some embodiments, the information regarding precursor flux may be used to dynamically control a deposition process, for example, to achieve process stability and to prevent or counter drift in a deposition process. FIG. 7 illustrates integrated precursor flux behavior as a function of time for an atomic layer deposition system for depositing TaN. The diamond symbols indicate integrated precursor flux as a function of time where no temperature adjustment is performed during a series of depositions, for up to approximately wafer 4500. A lower limit and an upper limit are shown by the horizontal dashed lines. As illustrated, the precursor flux when temperature is not adjusted remains generally between the upper limit and lower limit up to approximately the instance of processing of wafer 1500, and decreases substantially below the lower limit at higher wafer numbers. Given the upper limit and lower limit may represent a target operating range, the results illustrate the uncompensated flow of precursor is unable to maintain the process within the target operating range above wafer 1500. The triangle symbols represent integrated precursor flux as a function of time where temperature adjustment is performed during a series of depositions, in accordance with embodiments of the disclosure. In this set of data, the temperature of a precursor ampoule may be adjusted in accordance with procedures detailed below. As a result, the integrated flux is maintained over the entirety of a range measured (up to wafer 3500).

Figure 8:
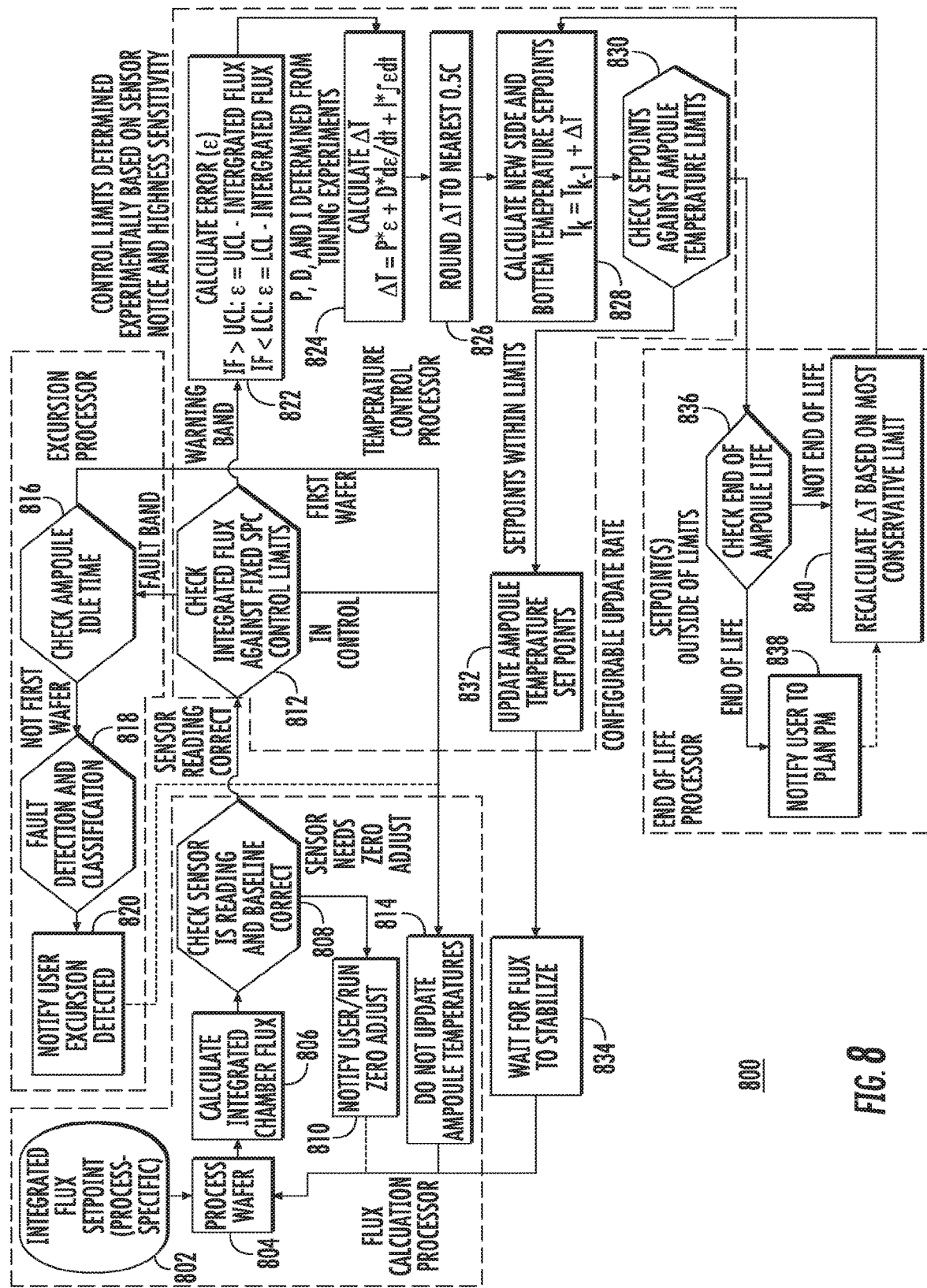
FIG. 8 presents an exemplary process flow according to embodiments of the disclosure.

Turning now to FIG. 8, there is shown a process flow 800, in accordance with embodiments of the disclosure. The process flow 800 may be implemented by the processors as described above, and as indicated in the figure. Notably, some operations may be performed by more than one processor. At block 802, an integrated precursor flux is set for a given deposition process. A setpoint may be established, where the integrated flux is to be determined based upon measurements of a precursor using a sensor assembly in accordance with the embodiments described above. In various embodiments, multiple parameters may be set or monitored. For example, a baseline ampoule side temperature and a baseline ampoule bottom temperature may be set as starting points for temperature compensation to be performed. Additional parameters may be employed to assign limits to ensure the temperature of a process stays within a safe range. Among these parameters are ampoule side temperature minimum, ampoule side temperature maximum, ampoule bottom temperature minimum, ampoule bottom temperature maximum, hot chamber temperature, and precursor degradation temperature.

At block 804, a substrate or wafer is processed according to the given deposition process. The flow proceeds to block 806, where an integrated chamber flux is calculated for the precursor, as represented, for example, at curve 504. At block 808, a sensor such as the detector 122 is checked to see if correct readings are being made and a baseline reading is correct. If a determination is made wherein the sensor needs adjusting the flow proceeds to block 810, where in one mode a signal is sent to a user indicating the sensor needs adjusting, while in another mode, an adjustment to the sensor is performed automatically. The flow then returns to block 804. If, at block 808, the sensor does not need adjusting, the flow proceeds to block 812, where the integrated precursor flux from block 806 is checked against fixed control limits. If the precursor flux indicates the process is under control or within control limits, the flow proceeds to block 814, where no adjustment is made to ampoule temperature. The flow then returns to block 804 where a wafer is processed while not having adjusted ampoule temperature for the precursor.

In some embodiments, as exemplified in process flow 800, two sets of limits may be specified, such as fault limits and waring limits. When a warning limit is exceeded, this condition triggers a temperature update. Fault limits are broader, wherein when a fault limit is exceeded, this condition indicates something has changed in the system (not the gradual drift expected over an ampoule lifetime) and additional action is required.

In the process flow 800, if, at block 812, a fault condition (fault band condition) is detected, the flow proceeds to block 816, where an ampoule idle time is checked. The flow then returns to block 814 if a first wafer is being processed. If a first wafer is not being processed, the flow proceeds to block 818, where fault detection and classification is performed. The flow then proceeds to block 820, where a notification signal is sent to notify a user an excursion has been detected. The flow may then then proceed to block 814. In different implementations, processing may be stopped or a user notified while processing continues via block 804.

If, at block 812, a warning band condition is determined, the flow proceeds to block 822, where an error calculation € is performed.

In different embodiments, warning and fault limits may be assigned by a user or alternatively may be calculated automatically in a software routine. In some examples, the limits represent a given number of standard deviations from the mean of a sample set.

In particular, the error calculation at block 822 may involve control limits, determined experimentally, based upon sensor noise and thickness sensitivity. The error value calculated may be based upon a subtraction of the integrated flux from an upper control limit (UCL) or lower control limit (LCL). The flow then proceeds to block 824.

At block 824, a temperature increment $\Delta T$ is determined. In one embodiment, the temperature increment may be calculated based upon $\Delta T = P*€ + D*d€/dt + I*\int €/dt$, where P, I and D are the proportional, integral, and derivative gains. In one instance, P, D, and I may be experimentally determined from tuning experiments. The flow then proceeds to block 826.

At block 826, the temperature increment, $\Delta T$, is rounded to a nearest level, such as to the nearest 0.5° C. The flow then proceeds to block 828, where new setpoints are calculated for side and bottom temperatures of an ampoule, wherein $T_K = T_{K-1} + \Delta T$, where $T_K$ is the temperature at time k, and $T_{k-1}$ is the previous temperature setpoint. The flow then proceeds to block 830.

At block 830, where the setpoints determined at block 828 are checked against current temperature limits for the ampoule containing the precursor. If, at block 830, the setpoints are within the limits, the flow then proceeds to block 832. These limits may include the aforementioned ampoule side temperature minimum, ampoule side temperature maximum, ampoule bottom temperature minimum, ampoule bottom temperature maximum, hot chamber temperature, and precursor degradation temperature.

At block 832, the ampoule temperature setpoints are updated based upon the new setpoints determined at block 828. The flow then proceeds to block 834 to wait for the precursor flux to stabilize, and then returns to block 804.

If, at block 830, the setpoints are not within the limits, the flow proceeds to block 836, where the end of life of the precursor ampoule is checked. At block 836, if a determination is made wherein the ampoule is at an end-of-ampoule life condition, the flow proceeds to block 838, where a signal is sent to notify a user for preventative maintenance. The flow then proceeds to block 840, where a temperature increment is recalculated based upon a most conservative limit. The most conservative limit may represent the lowest of the applicable maximum temperatures or highest of the applicable minimum temperatures. The flow then returns to block 828. If, at block 836, a determination is made wherein the ampoule is not at end of life, the flow proceeds directly to block 840. The end-of-life determination may be made based upon when temperature compensation is no longer able to maintain a deposition process within acceptable process conditions.

Figure 9A:
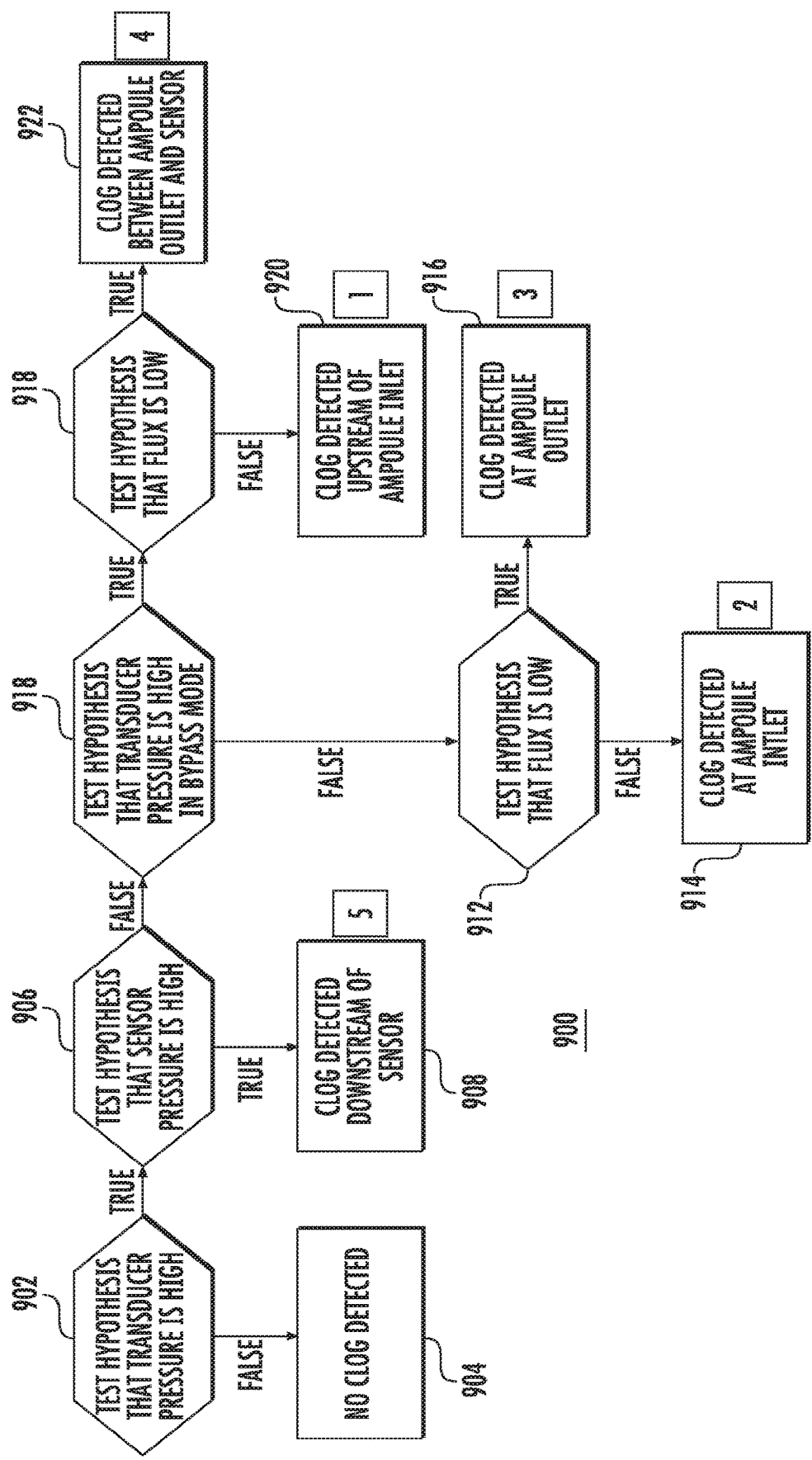
FIG. 9A presents an exemplary process flow according to embodiments of the disclosure.

Turning now to FIG. 9A there is shown a process flow 900 according to additional embodiments of the disclosure. The process flow 900 may be implemented by the clog-detection processor 168, and may be used to determine the presence of clogs and clog location within a delivery system for chemical deposition. A model delivery system 930, including precursor ampoule 932 and sensor assembly 934, are shown in block form in FIG. 9B. Turning to process flow 900, at block 902, a determination is made as to whether a transducer pressure in a gasline delivering a precursor is too high. The transducer pressure may be measured just downstream of a carrier mass flow controller in the gas line. An indication of "too high" may be determined statistically. A set of "good" recipes may be employed to determine the expected mean and standard deviation (sigma), wherein a deviation on the order of 3 sigma is used to determine if the pressure is high (depending on sample size and acceptable confidence level). If not, the flow proceeds to block 904, indicating no clog in a gasline is detected. If, at block 902, the transducer pressure is high, the flow proceeds to block 906, where a determination is made if the sensor assembly 934 pressure is too high. If so, the flow proceeds to block 908, where a signal is sent indicating a clog is detected downstream of the sensor assembly 934. If the pressure is not too high in the sensor assembly 934, the flow proceeds to block 910.

Figure 9B:
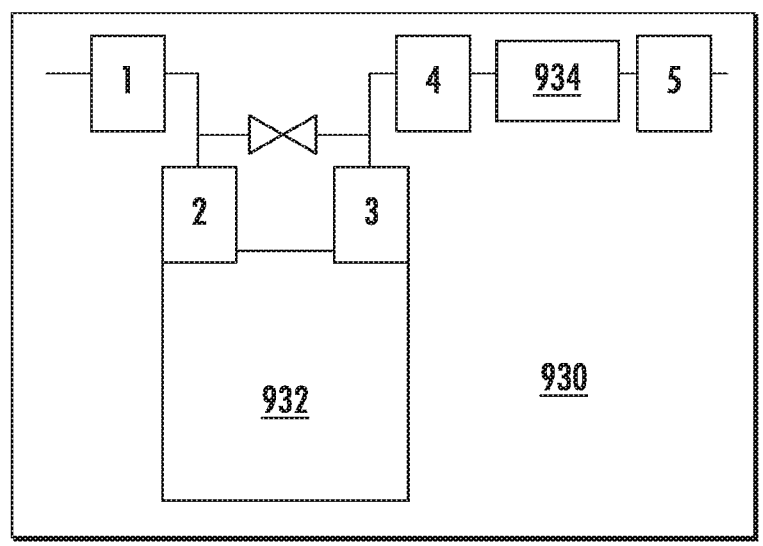
FIG. 9B presents a model system according to embodiments of the disclosure.

At block 910, a determination is made if the transducer pressure is high in a bypass mode, shown by position 4 in FIG. 9B. If not, the flow proceeds to block 912 where a determination is made as to whether precursor flux is low. The determination of whether the precursor flux is low may be made by measuring the precursor flux at the sensor assembly 934. In particular examples, the measured precursor flux is compared to "good" data using statistical approaches including mean and standard deviation. If, at block 912, the precursor flux is not low, the flow proceeds to block 914, where a signal is sent indicating a clog exists at the precursor ampoule 932 inlet, as shown by position 2. If, at block 912, the precursor flux is determined to be low, then the flow proceeds to block 916, where a signal is sent to indicate a clog is present at the precursor ampoule 932 outlet, as indicated by position 3.

If, at block 910, a determination is made wherein the transducer pressure is high in bypass mode, the flow proceeds to block 918, where a determination is made as to whether the precursor flux is low. If not, the flow proceeds to block 920, where a signal is generated indicating a clog exists upstream of the precursor ampoule 932 inlet, as indicated by position 1. If so, the flow proceeds to block 922, where a signal is sent indicating a clog between the precursor ampoule 932 outlet and sensor assembly 934, as indicated by position 4.

In sum, the present embodiments provide the advantages of the ability to determine precursor flux during operation of a chemical deposition system, to determine such changes in precursor flux in real time, to dynamically adjust operating parameters such as ampoule temperature in real time, in order to maintain precursor flow within acceptable limits. Other advantages include the ability to determine or predict end-of-life of a precursor ampoule so replacement need not take place before corrections cannot be made to maintain the precursor flow within limits. Further advantages include the ability to determine the presence of clogs in multiple different locations of a precursor delivery system.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An apparatus, comprising:
   a processor; and
   a memory unit coupled to the processor, including a flux control routine, the flux control routine operative on the processor to monitor a precursor flow, the flux control routine comprising:
      a flux calculation processor configured to determine a precursor flux value based upon a change in detected signal intensity received from a cell of a gas delivery system to deliver a precursor;
      a temperature control processor, configured to:
         determine a flux error value based upon the precursor flux value;
         determine a temperature adjustment ΔT, based upon the flux error value;
         calculate a new set of temperature setpoints to be applied to the ampoule; and
      an end-of-life processor, the end-of-life processor configured to: check for an end-of ampoule-life condition when the new set of temperature setpoints is not within the predetermined set of temperature limits.

2. The apparatus of claim 1, the flux calculation processor configured to determine the precursor flux value by:
   receiving a first reference signal in the cell, generated at a first instance, the first reference signal indicative of a detector performance at the first instance for a detector, the detector to detect a light intensity from a light source;
   receiving a background signal, generated at the first instance, the background signal being generated by the detector;
   receiving a second reference signal, generated at a second instance, subsequent to the first instance, the second reference signal indicative of the detector performance at the second instance for the detector; and
   receiving a precursor signal, generated at a third instance, subsequent to the first instance, when the precursor is flowing in the cell.

3. The apparatus of claim 1, the flux calculation processor configured to calculate an integrated flux of the precursor by determining the precursor flux value at a plurality of instances.

4. The apparatus of claim 2, the temperature control processor configured to:
   determine a warning band condition based upon the precursor flux value; and
   adjust the temperature of an ampoule based upon the warning band condition.

5. The apparatus of claim 1, the temperature control processor configured to adjust the temperature by:
   determining a temperature adjustment ΔT, where ΔT=P*€+D*d €/dt+I*∫€/dt, where P, I and D are a proportional, integral, and derivative gains, and where € is an error based upon current temperature limits of the ampoule.

6. The apparatus of claim 1, the temperature control processor configured to adjust the temperature by:
   determining a flux error value based upon the precursor flux value;
   determining a temperature adjustment ΔT, based upon the flux error value;
   calculating a new set of temperature setpoints to be applied to the ampoule; and
   applying the new set of temperature setpoints to control heating of the ampoule when the new set of temperature setpoints are within a predetermined set of temperature limits.

7. The apparatus of claim 6, the flux control routine further comprising an end-of-life processor, the end-of-life processor configured to:
   recalculate ΔT to generate a conservative ΔT based upon a most conservative limit when the end-of ampoule life condition has not been met; and
   calculate the new set of temperature setpoints to be applied to the ampoule based upon the conservative ΔT.

8. The apparatus of claim 1, the flux control routine further comprising an excursion processor, the excursion processor configured to:
   determine a fault condition based upon the precursor flux value; and
   send a notification signal of an excursion, when a substrate being processed is during the fault condition is not a first substrate.

9. The apparatus of claim 1, the flux control routine further comprising a clog detection processor, the clog detection processor configured to:
   receive a cell pressure reading for the cell;
   receive the precursor flux value; and
   determine a clog location based upon the cell pressure reading and precursor flux value.

10. An apparatus for controlling precursor flow, comprising:
    a source to output a precursor;
    a sensor assembly communicatively coupled to the source, the sensor assembly comprising:
    a cell, coupled to the source, to receive and conduct the precursor;
    a light source, disposed on a first side of the cell, to transmit light into the cell; and
    a detector, disposed on a second side of the cell, opposite the light source, to detect light transmitted through the cell; and a control system, the control system arranged to determine a precursor flux value based upon a change in detected light intensity received from the cell during flow of the precursor through the cell, the control system comprising:
  a flux calculation processor configured to determine a precursor flux value based upon the change in detected signal intensity;
  a temperature control processor, configured to:
    determine a flux error value based upon the precursor flux value;
    determine a temperature adjustment ΔT, based upon the flux error value; and
    calculate a new set of temperature setpoints to be applied to the ampoule; and
  an end-of-life processor, the end-of-life processor configured to: check for an end-of ampoule-life condition when the new set of temperature setpoints is not within the predetermined set of temperature limits.

11. An apparatus, comprising:
  a processor; and
  a memory unit coupled to the processor, including a flux control routine, the flux control routine operative on the processor to monitor a precursor flow, the flux control routine comprising:
    a flux calculation processor configured to:
      determine a precursor flux value based upon a change in detected signal intensity received from a cell of a gas delivery system to deliver a precursor; and
    a clog detection processor, the clog detection processor configured to:
      receive a cell pressure reading for the cell;
      receive the precursor flux value; and
      determine a clog location based upon the cell pressure reading and precursor flux value.

12. The apparatus of claim 11, the flux control routine further comprising a temperature control processor, configured to determine a warning band condition based upon the precursor flux value; and adjust a temperature of an ampoule based upon the warning band condition.

13. The apparatus of claim 12, the temperature control processor configured to adjust the temperature by:
  determining an error value based upon the precursor flux value;
  determining a temperature adjustment ΔT, based upon the error value;
  calculating a new set of temperature setpoints to be applied to the ampoule; and
  applying the new set of temperature setpoints to control heating of the ampoule when the new set of temperature setpoints are within a predetermined set of temperature limits.

14. The apparatus of claim 11, the flux control routine further comprising an excursion processor, the excursion processor configured to:
  determine a fault condition based upon the precursor flux value; and
  send a notification signal of an excursion, when a substrate being processed is during the fault condition is not a first substrate.

15. The apparatus of claim 11, the flux control routine further comprising an end-of-life processor, the end-of-life processor configured to:
  check for an end-of ampoule-life condition when the new set of temperature setpoints is not within the predetermined set of temperature limits;
  recalculate ΔT to generate a conservative ΔT based upon a most conservative limit when the end-of ampoule life condition has not been met; and
  calculate the new set of temperature setpoints to be applied to the ampoule based upon the conservative ΔT.

* * * * *